United States Patent
Hall et al.

(10) Patent No.: US 8,405,385 B2
(45) Date of Patent: Mar. 26, 2013

(54) TEMPERATURE AND DRIFT COMPENSATION IN MAGNETORESISTIVE SENSORS

(75) Inventors: Drew A. Hall, Stanford, CA (US); Richard Gaster, Los Altos, CA (US); Sebastian J. Osterfeld, Mountain View, CA (US); Shan X. Wang, Portola Valley, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 528 days.

(21) Appl. No.: 12/661,158

(22) Filed: Mar. 10, 2010

(65) Prior Publication Data
US 2010/0231203 A1 Sep. 16, 2010

Related U.S. Application Data

(60) Provisional application No. 61/209,829, filed on Mar. 10, 2009.

(51) Int. Cl.
*G01B 7/14* (2006.01)
*G01R 35/00* (2006.01)
(52) U.S. Cl. ............... 324/207.21; 324/202; 324/225
(58) Field of Classification Search ........... 324/207.21, 324/202, 225
See application file for complete search history.

(56) References Cited

U.S. PATENT DOCUMENTS

| | | | |
|---|---|---|---|
| 6,724,187 B2 | 4/2004 | Nix | |
| 6,882,145 B2 | 4/2005 | Ehresmann et al. | |
| 6,882,146 B2 | 4/2005 | Maiwald | |
| 7,027,263 B2 | 4/2006 | Ottesen et al. | |
| 7,048,890 B2 | 5/2006 | Coehoorn et al. | |
| 7,084,622 B2 | 8/2006 | Nix | |
| 7,097,110 B2 | 8/2006 | Sheperek et al. | |
| 7,239,123 B2 | 7/2007 | Rannow et al. | |
| 7,312,609 B2 | 12/2007 | Schmollngruber et al. | |
| 7,319,322 B2 | 1/2008 | Schmitt et al. | |
| 2005/0100930 A1 | 5/2005 | Wang et al. | |
| 2005/0258821 A1 | 11/2005 | Wang et al. | |
| 2008/0224695 A1 | 9/2008 | Leroy et al. | |

FOREIGN PATENT DOCUMENTS

WO   WO 2007/113724   10/2007

OTHER PUBLICATIONS

Han et al., "A novel zero-drift detection method for highly sensitive GMR biochips", 2006, pp. 3560-3562, IEEE Trans. Magnetics v42n10.
Han et al., "A High-Density Magnetoresistive Biosensor Array with Drift-Compensation Mechanism", Feb. 2007, p. 168, 2007 IEEE Intl. Solid State Circuits Conference.
Han et al., "A novel zero-drift detection method for highly sensitive GMR biochips", Oct. 2006, pp. 3560-3562, IEEE Trans. Magn. v42(10).
De Boer et al., "An integrated and sensitive detection platform for magneto-resistive biosensors", Nov. 2006, pp. 2366-2370, Biosensors and Bioelectronics v22.

(Continued)

*Primary Examiner* — Reena Aurora
(74) *Attorney, Agent, or Firm* — Lumen Patent Firm

(57) ABSTRACT

Double modulation of a magnetoresistive sensor entails modulating both an excitation (e.g., voltage or current) applied to the sensor and a tickling magnetic field applied to the sensor. The excitation and magnetic field are modulated at different frequencies $f_c$ and $f_f$ respectively. As a result of the double modulation, the sensor output spectrum includes a carrier tone (CT) at frequency $f_c$ and side tones (STs) at frequencies $f_c \pm f_f$. A baseline relation between CT amplitude and ST amplitude is determined (e.g., by measuring CT and ST amplitude while drift occurs in the absence of a sample). During sensor operation, raw ST measurements are corrected using corresponding raw CT measurements to provide corrected ST measurements as the sensor output.

15 Claims, 4 Drawing Sheets

OTHER PUBLICATIONS

Li et al., "Detection of single micron-sized magnetic bead and magnetic nanoparticles using spin valve sensors for biological applications", May 2003, pp. 7557-7559, Journal of Applied Physics v93(10).

Li et al., "Spin valve sensors for ultrasensitive detection of superparamagnetic nanoparticles for biological applications", Nov. 2005, pp. 98-106, Sensors and Actuators A v126.

Tondra et al., "Model for detection of immobilized superparamagnetic nanosphere assay labels using giant magnetoresistive sensors", Jul. 2000, pp. 1125-1129, J. Vac. Sci. Tech. A v18(4).

Graham et al., "Magnetoresistive-based biosensors and biochips", Sep. 2004, pp. 455-462, Trends in Biotechnology v22(9).

Lenssen et al., "Sensor properties of a robust giant magnetoresistance material system at elevated temperatures", May 2000, pp. 6665-6667, Journal of Applied Physics v87(9).

Wang et al., "Towards a magnetic microarray for sensitive diagnostics", Mar. 2005, pp. 731-736, Journal of Magnetism and Magnetic Materials v293.

Xu et al., "Giant magnetoresistive biochip for DNA detection and HPV genotyping", Apr. 2008, pp. 99-103, Biosensors and Bioelectronics v24.

US 8,405,385 B2

TEMPERATURE AND DRIFT COMPENSATION IN MAGNETORESISTIVE SENSORS

CROSS REFERENCE TO RELATED APPLICATIONS

This application claims the benefit of U.S. provisional patent application 61/209,829, filed on Mar. 10, 2009, entitled "Temperature and Drift Compensation in GMR Devices", and hereby incorporated by reference in its entirety.

GOVERNMENT SPONSORSHIP

This invention was made with US government support under contract number HDTRA1-07-1-0030 awarded by the Defense Threat Reduction Agency, contract number 1U54CA119367-01 awarded by the National Cancer Institute, and under contrast number ECCS-0801385, awarded by the National Science Foundation. The government has certain rights in this invention.

FIELD OF THE INVENTION

This invention relates to magnetoresistive sensors.

BACKGROUND

Magnetoresistive sensors provide a change of electrical resistance in response to changes in a magnetic field the sensor is exposed to. However, changes in other physical parameters, especially temperature, can also cause the electrical resistance of a magnetoresistive sensor to change. Traditionally, such drift effects have been alleviated by employing magnetoresistive sensors in an electrical bridge configuration. In this approach, a secondary magnetoresistive sensor is used as a reference, and sees the same environment as the primary magnetoresistive sensor, except that the secondary sensor is not exposed to the sample being measured. The differential signal between the primary and secondary sensors is a drift-compensated output signal.

However, recent applications of magnetoresistive sensors, such as biological assays, often require the use of a large array of magnetoresistive sensors. In such situations, the use of traditional drift compensation using an electrical bridge circuit is highly undesirable, since it entails the use of a separate reference detector (and associated bridge circuitry) for every element in the sensor array. Accordingly, methods of correcting for temperature and drift effects that don't rely on bridge circuits are of interest, especially for large sensor arrays.

One approach that has been considered is to control the temperature of the magnetoresistive sensor (e.g., as in U.S. Pat. No. 7,097,110). Elimination of temperature drift by controlling the temperature also leads to elimination of the temperature drift effect on sensor output. Another approach is to provide a temperature calibration of the sensor, such that sensor output is corrected according to measured temperature using the temperature calibration (e.g., as in U.S. Pat. No. 7,239,123).

However, conventional drift/temperature compensation approaches tend to suffer from various disadvantages. Some approaches are unduly complex or difficult to realize in practice. For example, temperature control can be difficult to realize for all elements of a large sensor array. Calibration approaches can also suffer from undue complexity, and/or an inability to provide corrected outputs in real time. Accordingly, it would be an advance in the art to provide improved drift/temperature correction for magnetoresistive sensors.

SUMMARY

Double modulation of a magnetoresistive sensor entails modulating both an excitation (e.g., voltage or current) applied to the sensor and a tickling magnetic field applied to the sensor. The excitation and magnetic field are modulated at different frequencies $f_c$ and $f_f$ respectively. As a result of the double modulation, the sensor output spectrum includes a carrier tone (CT) at frequency $f_c$ and side tones (STs) at frequencies $f_c \pm f_f$. A baseline relation between CT amplitude and ST amplitude is determined (e.g., by measuring CT and ST amplitude while drift occurs in the absence of a sample). During sensor operation, raw ST measurements are corrected using corresponding raw CT measurements to provide corrected ST measurements as the sensor output.

DETAILED DESCRIPTION

Figure 1:
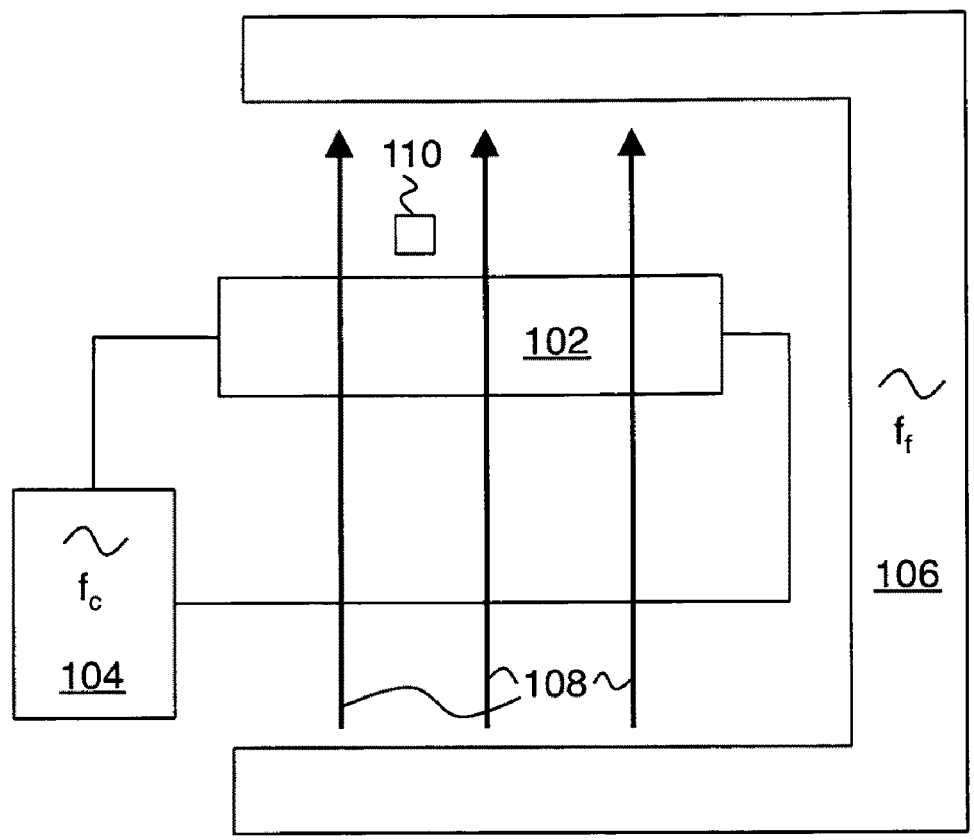
FIG. 1 shows an exemplary embodiment of the invention.

FIG. 1 shows an exemplary embodiment of the invention. In this example, a magnetoresistive sensor 102 is disposed in a tickling magnetic field 108 provided by a magnetic field source 106. A magnetoresistive sensor is any sensor having an electrical resistance that depends on magnetic field. Although many variations are possible, depending on the direction of current flow and the direction of the magnetic field, all such variations are included in the general category of magnetoresistive sensors. In some cases, a magnetic bias can be applied to sensor 102. Such magnetic bias can be in the same direction as the tickling field 108, or in any other direction (e.g., orthogonal to the tickling field). Tickling magnetic field 108 is modulated at frequency $f_f$. An electrical source 104 provides an excitation (e.g., a voltage or current) to magnetoresistive sensor 102. The excitation is modulated at frequency $f_c$. The modulation frequencies $f_f$ and $f_c$ are different.

Figure 2:
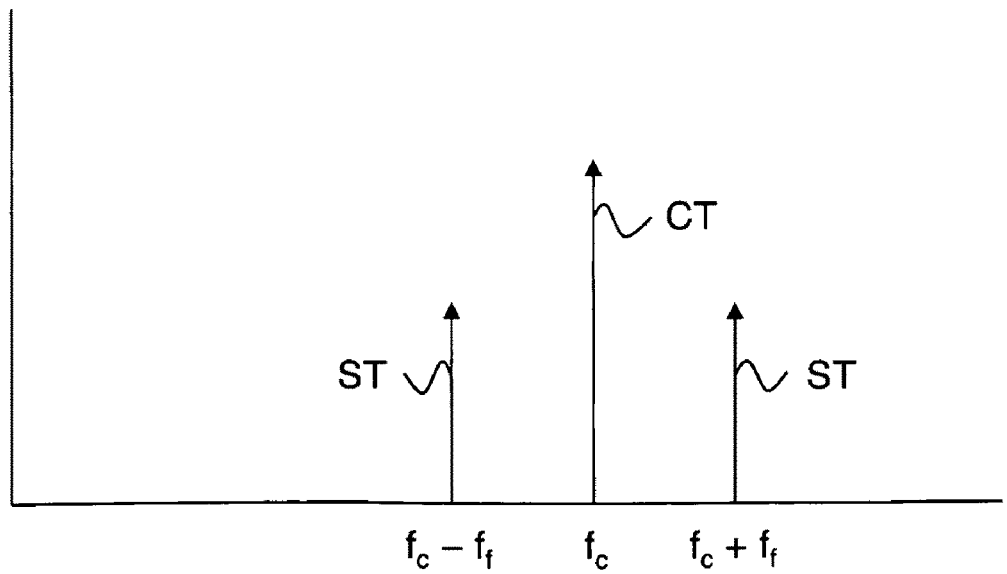
FIG. 2 shows an output spectrum relating to the example of FIG. 1.

As a result of this double modulation scheme, the sensor output spectrum is schematically as shown on FIG. 2, and includes a carrier tone (CT) at frequency $f_c$ and side tones (STs) at frequencies $f_c \pm f_f$. Typically, $f_c$ is greater than $f_f$, but this is not required. The output of sensor 102 can be either a voltage or a current. More specifically, the output is a current if the excitation is a voltage, and the output is a voltage if the excitation is a current.

If a magnetic particle 110 (e.g., a paramagnetic or super-paramagnetic nano-particle) is disposed near sensor 102, the effect of particle 110 on the magnetic field at sensor 102 can lead to an observable change in the sensor output. Thus, this arrangement can operate as a magnetic sensor. However, it is important to note that the carrier tone amplitude does not depend on the presence/absence of magnetic particles near sensor 102. Therefore, the useful sensor output is only the side tone amplitude. The physical basis for this effect is that the carrier tone amplitude depends on the normal resistance of sensor 102, while the side tone amplitude depends on the magnetoresistance of sensor 102.

Even though the carrier tone amplitude is unaffected by magnetic particle 110, it can be employed to provide drift-corrected side tone measurements as follows. For ease of exposition, the case of temperature drift will be described, but the following principles are also applicable to any other source of sensor drift. To begin, it is helpful to define the sensor baseline as the condition where no magnetic particles 110 are close enough to sensor 102 to have an observable effect on the sensor output. Thus, the sensor baseline is a background condition where no magnetic field being measured (e.g., no sample) is present. Under baseline conditions, sensor drift (e.g., a varying sensor temperature) will lead to changes in both CT and ST amplitude.

Figure 3:
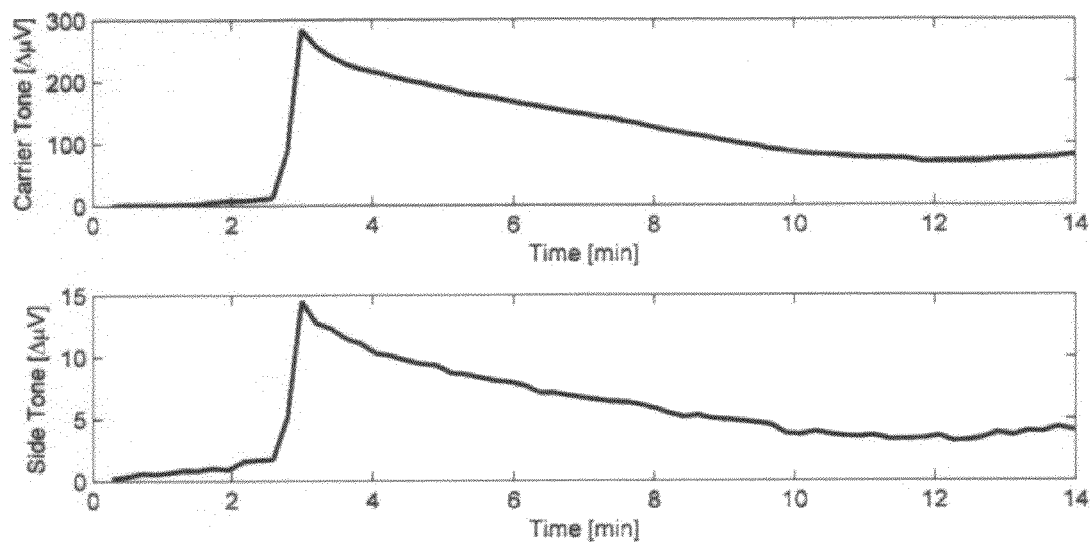
FIG. 3 shows plots of carrier tone and side tone amplitude change as sensor temperature is intentionally changed.
Figure 4:
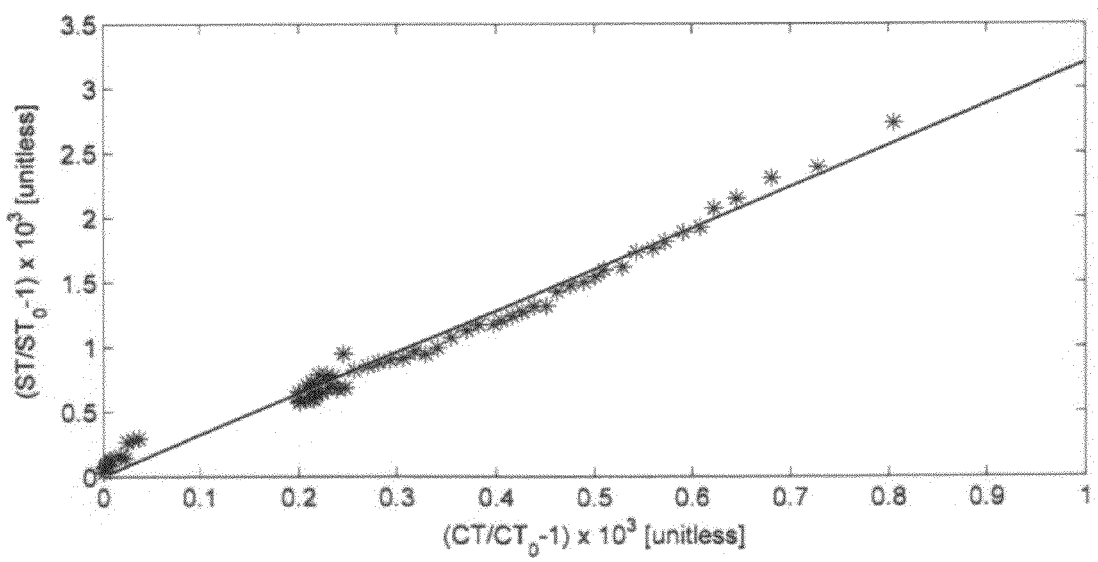
FIG. 4 shows an example of an empirically determined ST-CT relation.

FIG. 3 shows an example of such changes, where an intentional temperature change is applied to a magnetoresistive sensor under baseline conditions, and changes in CT and ST amplitudes are shown. The top plot shows the change in CT amplitude, and the bottom plot shows the change in ST amplitude. In this example, it is apparent that changes in CT and ST amplitude are closely related. FIG. 4 make this relation more apparent.

In FIG. 4, the change in ST amplitude is plotted vs. the change in CT amplitude. The points are measured data points, and the dashed line is a linear fit. Although in this example, the relation between the CT amplitude change ($\Delta C$) and the baseline ST amplitude change ($\Delta S_B$) is a simple linear relation, it is helpful to use a more general formalism in the following. According, we define a baseline relation between CT amplitude and ST amplitude as being a function $\Delta S_B(\Delta C)$ where the CT and ST amplitude changes are defined with respect to a baseline operating point ($CT_0$, $ST_0$). The choice of which operating point to employ is not critical in practicing the invention. This relation can be empirically determined for any sensor materials and/or configuration using straightforward measurements.

When a sample is present, the available data is a carrier tone measurement $\Delta C$ and a raw side tone measurement $S_{raw}$ (or $\Delta S_{raw}$). As indicated above, $\Delta C$ does not depend on the magnetic sample, and can therefore be regarded as effectively providing a real time measurement of sensor drift.

In some cases, it is convenient to use normalized CT and ST variables, e.g. by defining $\Delta s = \Delta S/ST_0$ and $\Delta c = \Delta C/CT_0$. Here the function $\Delta s_B(\Delta c)$ can readily be determined from $\Delta S_B(\Delta C)$, and either of these relations, or any other mathematically equivalent form, are suitable for use as the baseline relation between CT amplitude and ST amplitude. We employ a convention where lower case notation is used for normalized quantities that are dimensionless, while upper case is used for non-normalized quantities that have physical dimensions. For example, $\Delta s_B(\Delta c)$ is a dimensionless function that relates the normalized change in side tone amplitude to the normalized change in carrier tone amplitude. The function $\Delta S_B(\Delta C)$ is the same relation expressed in term of non-normalized quantities having dimensions (e.g., Volts).

In cases where both the CT and ST amplitudes have a linear temperature drift, we have baseline relations $\Delta c = \alpha \Delta T$ and $\Delta s_B = \beta \Delta T$, where $\Delta T$ is the temperature change relative to the baseline operating point. If the excitation is a current and the output is a voltage, then $\alpha$ is the temperature coefficient of the normal resistance, and $\beta$ is the temperature coefficient of the magnetoresistance. If the excitation is a voltage and the output is a current, then the relation of $\alpha$ and $\beta$ to the underlying material temperature coefficients is slightly more complex. The dependence of empirical parameters such as $\alpha$ and $\beta$, which are defined in terms of the CT and ST amplitudes, on the underlying material parameters is not critical in practicing the invention.

We define a correction factor as follows:

$$CF = \frac{1}{1 + \Delta s_B(\Delta c)} \quad (1)$$

where $S_{corr} = CF \times S_{raw}$. If $\Delta c = \alpha \Delta T$ and $\Delta s_B = \beta \Delta T$, then $CF = 1/(1 + \kappa \Delta c)$, where $\kappa = \beta/\alpha$. The following equations demonstrate temperature independence of $S_{corr}$ under baseline conditions for this linear example:

$$\begin{aligned} S_{corr} &= S_{raw} CF \quad (2) \\ &= \frac{ST_0(1 + \beta \Delta T)}{1 + \kappa \Delta c} \\ &= \frac{ST_0(1 + \beta \Delta T)}{1 + (\beta/\alpha)(\alpha \Delta T)} \\ &= ST_0 \end{aligned}$$

The same correction factor CF can be applied to raw side tone measurements taken when a sample is present to provide corrected side tone measurements as the sensor output.

This approach to correcting raw ST measurements can be expressed in any number of mathematically equivalent forms (or approximately equivalent forms). For example, the correction can be expressed as an additive term by assuming that the raw side tone measurement $S_{raw}$ includes a sensor drift contribution equal to $\Delta S_B(\Delta C)$. In this approach, the corrected side tone output is given by $$S_{corr} = S_{raw} - \Delta S_B(\Delta C). \quad (3)$$

This approach is equivalent to the use of the correction factor CF, in first order.

The use of CT measurements and an ST(CT) baseline to provide corrected ST measurements is generally applicable to any situation where the sensor output can drift. As indicated above, it is applicable to temperature-induced sensor drift. It is also applicable to other sources of sensor output drift, including but not limited to: inputs to the magnetoresistive sensor (e.g., voltage or current operating point); and environmental parameters of the sensor (e.g., temperature, pressure, etc.).

The baseline ST(CT) relation can be expressed in any convenient form in practicing the invention. For example, it can be expressed in terms of curve fit parameters (e.g., the slope and intercept of a linear fit). In more complicated cases, a lookup table can be employed to provide a point wise definition of this function. Interpolation can be used to provide function values at intermediate points.

Figure 5:
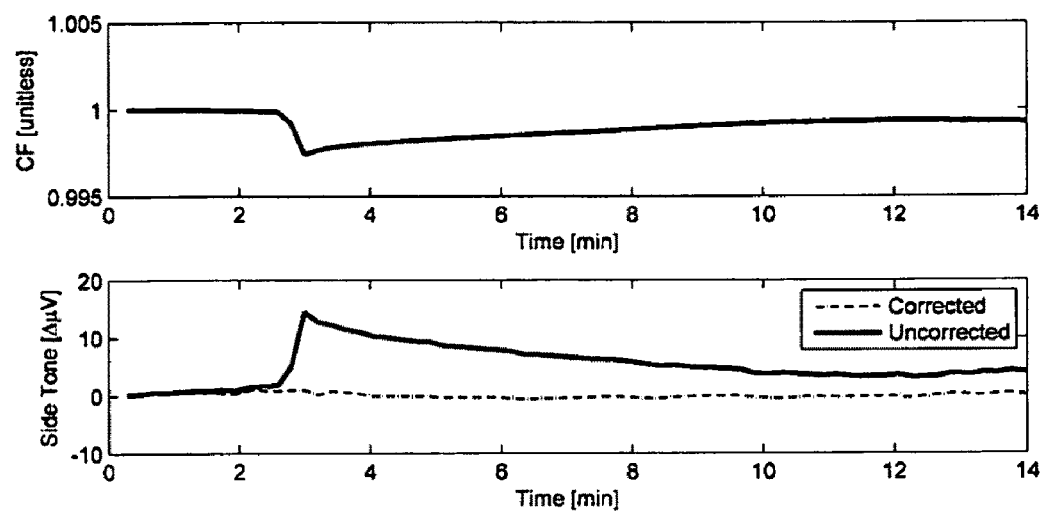
FIG. 5 shows exemplary results of correcting side tone output.

FIG. 5 shows exemplary results of correcting side tone output. The top plot show the correction factor CF, and the bottom plot compared corrected and uncorrected ST outputs under baseline conditions. The effectiveness of the temperature correction in removing the ST temperature dependence is apparent.

An important aspect of the present approach is that ST output can be corrected in real-time (i.e., while acquiring real measurement data). The ST(CT) baseline needs to be determined before data is taken, but once this is done, the corrections can be applied in real time. As an alternative, it is also possible to perform the correction with post-processing after acquisition of the CT and raw ST measurements.

Figure 6:
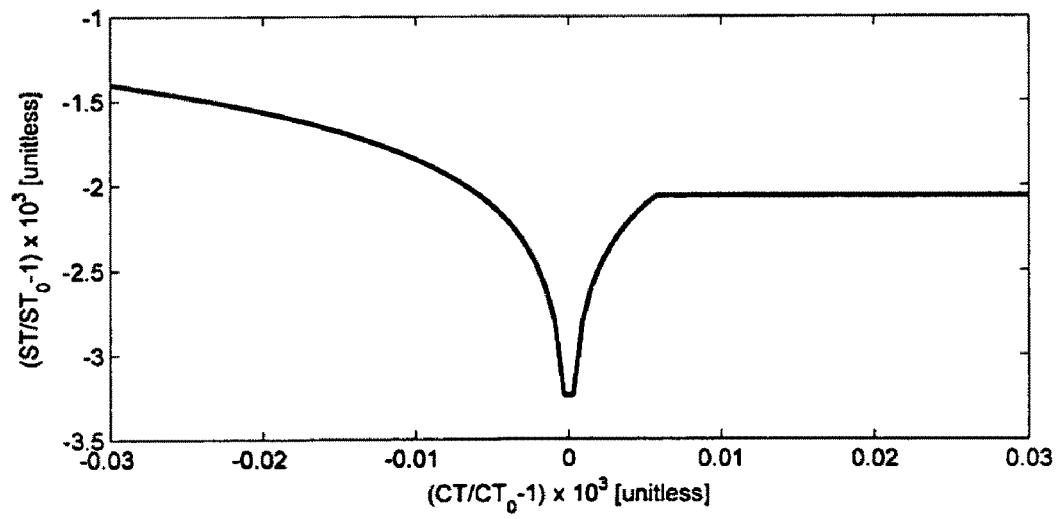
FIG. 6 is a hypothetical example of a non-linear ST-CT relation.

FIG. 6 is a hypothetical example of a non-linear ST(CT) relation. Although it is unlikely for a sensor to have such a ST(CT) relation, the complicated shape of this relation is no impediment to practicing the invention. A lookup table and interpolation if/as needed would suffice to enable correction of the ST output of such a sensor.

Figure 7:
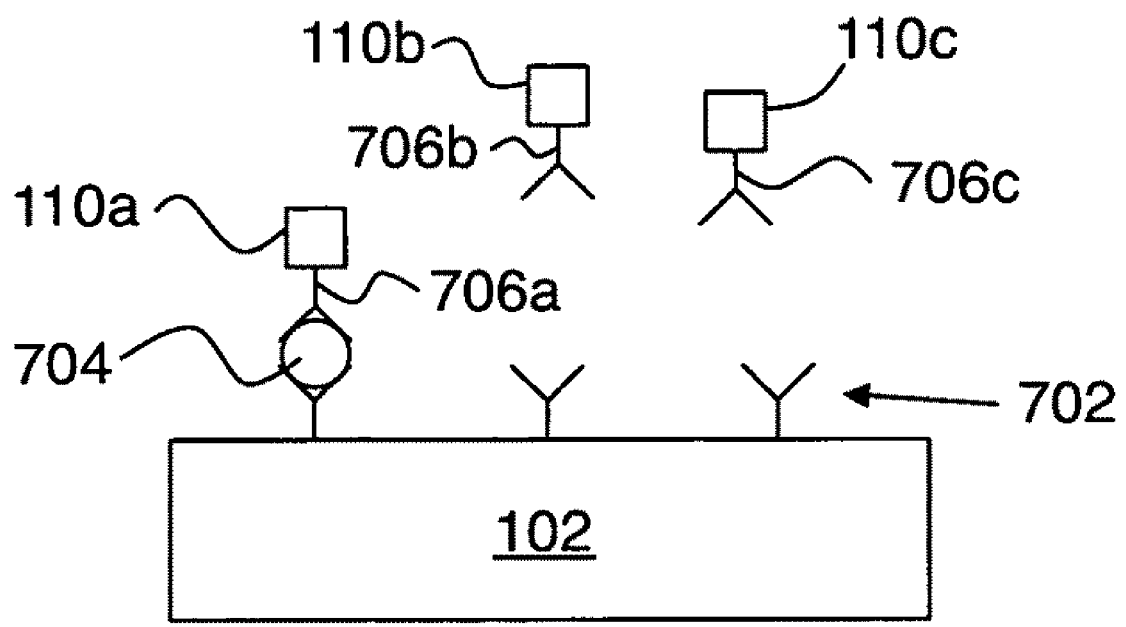
FIG. 7 shows an application of magnetoresistive sensors to biological assays.

One important application of magnetoresistive sensors is to biological assays. FIG. 7 shows an example application of magnetoresistive sensors to biological assays. In this example, capture antibodies 702 are present on the surface of magnetoresistive sensor 102. The capture antibody 702 selectively binds the analyte 704. After this step, detection antibodies (706a, 706b, and 706c) having magnetic labels (110a, 110b, and 110c) are provided to complete the assay. At locations where an analyte is bound, the detection antibody+ magnetic label also binds (e.g., antibody 706a and label 110a on analyte 704). Magnetic detection of the bound magnetic labels thereby provides a biological assay.

For simplicity, the preceding description has considered the single-sensor case. This drift correction approach is also applicable to arrays having any number of magnetoresistive sensors. In such arrays, the field modulation frequency $f_f$ is typically the same for all array elements, while the excitation frequency $f_c$ can be the same or different for each sensor array element. Baseline ST(CT) relations can be obtained for each element of the array independently, and the corrections can be applied individually to each array element. This flexibility is a significant advantage of the present approach compared to alternatives such as relying on a single temperature measurement to provide the temperature for all elements of the array. Since uniform array temperature is unlikely in practice, it is important to provide temperature/drift correction that is individually applicable to each array element (as in the present approach), and can thereby cope with non-uniform conditions across the array.

The invention claimed is:

1. A magnetoresistive sensor apparatus comprising:
  a) a magnetoresistive sensor;
  b) a magnetic field source that provides a tickling magnetic field having a modulation frequency of $f_f$, wherein said magnetoresistive sensor is disposed in said tickling magnetic field;
  c) an electrical source configured to provide an excitation to said magnetoresistive sensor having a modulation frequency of $f_c$, wherein $f_f$ and $f_c$ are distinct, and wherein an output spectrum of said sensor includes a carrier tone (CT) at frequency $f_c$ and side tones (STs) at frequencies $f_c \pm f_f$, wherein the carrier tone has a CT amplitude and the side tones have an ST amplitude; and
  d) a processor configured to determine a baseline relation between the CT amplitude and the ST amplitude in said output spectrum;
  wherein operation of said apparatus includes measuring corresponding CT and ST amplitudes when a sample is present to provide an input CT measurement and an input ST measurement;
  wherein said apparatus is configured to correct the input ST measurement using said baseline relation and the input CT measurement to provide a corrected ST measurement as an output.

2. The apparatus of claim 1, wherein said corrected ST measurement is provided in real time during acquisition of said input CT measurement and said input ST measurement.

3. The apparatus of claim 1, wherein said corrected ST measurement is provided by post-processing after acquisition of said input CT measurement and said input ST measurement-a.

4. The apparatus of claim 1, wherein said electrical source is a voltage source or a current source.

5. A method for correcting the output of a magnetoresistive sensor, the method comprising:
  a) providing a magnetoresistive sensor;
  b) disposing said magnetoresistive sensor in a tickling magnetic field having a modulation frequency of $f_f$;
  c) providing an excitation to said magnetoresistive sensor having a modulation frequency of $f_c$, wherein $f_f$ and $f_c$ are distinct, and wherein an output spectrum of said sensor includes a carrier tone (CT) at frequency $f_c$ and side tones (STs) at frequencies $f_c \pm f_f$, wherein the carrier tone has a CT amplitude and the side tones have an ST amplitude;
  d) determining a baseline relation between the CT amplitude and the ST amplitude in said output spectrum;
  e) measuring corresponding CT and ST amplitudes when a sample is present to provide an input CT measurement and an input ST measurement;
  f) correcting said input ST measurement using said baseline relation and said input CT measurement to provide a corrected ST measurement; and
  g) providing said corrected ST measurement as an output.

6. The method of claim 5, further comprising repeating said steps (e), (f), and (g) sequentially in order to provide real time correction for multiple ST measurements.

7. The method of claim 5, further comprising repeating said step (e) to provide a set of input (CT, ST) data points, wherein said corrected ST measurement for each of said data points is provided by post-processing said set of input (CT, ST) data points.

8. The method of claim 5, wherein said determining a baseline relation between CT amplitude and ST amplitude comprises collecting ST vs. CT data as the temperature of said magnetoresistive sensor varies.

9. The method of claim 5, wherein said determining a baseline relation between CT amplitude and ST amplitude comprises collecting ST vs. CT data as an input to said magnetoresistive sensor varies.

10. The method of claim 5, wherein said determining a baseline relation between CT amplitude and ST amplitude comprises collecting ST vs. CT data as an environmental parameter of said magnetoresistive sensor varies.

11. The method of claim 5, wherein said determining a baseline relation between CT amplitude and ST amplitude comprises collecting ST vs. CT data followed by determining a curve fit relating baseline ST amplitude to baseline CT amplitude.

12. The method of claim 11, wherein said curve fit is a linear fit.

13. The method of claim 5, wherein said sample comprises paramagnetic or superparamagnetic nano-particles.

14. The method of claim 13, wherein said nano-particles are labels on biological molecules.

15. The method of claim 5, wherein said excitation is a voltage or current applied to said magnetoresistive sensor.

* * * * *